United States Patent
Camera et al.

(10) Patent No.: US 6,424,557 B2
(45) Date of Patent: Jul. 23, 2002

(54) INTEGRATED DEVICE WITH TRIMMING ELEMENTS

(75) Inventors: Alessandro Camera, Savona; Paolo Sandri; Ignazio Bellomo, both of Milan; Filippo Marino, Catania, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 40 days.

(21) Appl. No.: 09/728,571

(22) Filed: Nov. 30, 2000

(30) Foreign Application Priority Data

Dec. 1, 1999 (EP) .............................. 99830746

(51) Int. Cl.[7] .............................................. G11C 17/00
(52) U.S. Cl. ...................................... 365/104; 365/100
(58) Field of Search .......................... 365/104, 100, 365/148, 189.02, 189.05

(56) References Cited

U.S. PATENT DOCUMENTS

| | | | |
|---|---|---|---|
| 4,238,839 A | 12/1980 | Redfern et al. ............... | 365/96 |
| 4,412,241 A * | 10/1983 | Nelson ......................... | 357/51 |
| 4,827,222 A * | 5/1989 | Hester et al. ................ | 330/257 |
| 5,412,594 A * | 5/1995 | Moyal et al. ................. | 365/96 |
| 5,623,436 A * | 4/1997 | Sowards et al. .............. | 365/45 |
| 6,307,801 B1 * | 10/2001 | Ogawa et al. ............... | 365/226 |

FOREIGN PATENT DOCUMENTS

| | | |
|---|---|---|
| EP | 0490511 A2 | 6/1992 |
| JP | 04103160 | 4/1992 |

* cited by examiner

*Primary Examiner*—Richard Elms
*Assistant Examiner*—Anh Phung
(74) *Attorney, Agent, or Firm*—Lisa K. Jorgenson; Robert Iannucci; Seed IP Law Group PLLC

(57) ABSTRACT

An integrated device comprises at least one circuit element and a plurality of trimming elements which can be connected selectively to the at least one circuit element in order to achieve a predetermined tolerance of a characteristic parameter of the at least one circuit element; the integrated device includes a plurality of electronic switches, each of which can be switched between a first state and a second state in which it activates and deactivates a corresponding one of the trimming elements, respectively, and a memory for storing an indication of the states of the electronic switches and for operating each electronic switch in the first state or in the second state according to the indication stored.

10 Claims, 2 Drawing Sheets

INTEGRATED DEVICE WITH TRIMMING ELEMENTS

TECHNICAL FIELD

The present invention relates to an integrated device with trimming elements.

BACKGROUND OF THE INVENTION

In integrated devices of various types there are circuit elements of which a characteristic parameter such as, for example, resistance, has to have a predetermined tolerance; typically, these circuit elements are used to generate a reference quantity (a voltage or a current) and the tolerance must therefore be very low to ensure that the reference quantity has a sufficiently precise and stable value. However, a very low tolerance value is difficult to achieve because of accuracy limits inherent in the processes by which the integrated devices are produced (machine inaccuracy, inaccuracy of photolithography and etching processes, and the like).

This problem is generally solved by a subsequent trimming process of the circuit elements. In particular, various trimming elements provided in the integrated device can be connected to the circuit element selectively in order to correct an inaccuracy thereof. During the trimming process, the characteristic parameter of the circuit element is measured and compared with a nominal value thereof. The trimming elements are activated or deactivated according to the result of this comparison so as to achieve the required tolerance.

A prior art solution, known as "metal zapping," consists of the use of metal fuses. The circuit element is formed by several elemental components connected to one another, for example, in series; a trimming element in series with a metal fuse is connected in parallel with each elemental component. The terminals of each metal fuse are accessible from outside the integrated device by means of a pair of firing pads. If a current of a high value (for example, 300 mA) is supplied to the firing pads, the metal fuse is blown; the corresponding trimming element is thus deactivated (since it is disconnected from the elemental component).

A disadvantage of this solution is that, in order to be blown, the metal fuses must not be covered by a protective layer. Any external agents may consequently create a short-circuit in the region of a blown metal fuse or may corrode a metal fuse which has not blown; this undesirably modifies the characteristic parameter of the circuit element, rendering the integrated device unreliable.

A different prior art solution, known as "Zener zapping," consists of the replacement of the metal fuses with Zener diodes. If a current of high value is supplied to the firing pads, the Zener diode is blown and is brought to a breakdown condition in which it behaves as a short-circuit; the corresponding trimming element is thus activated (since it is connected to the elemental component).

The results of the trimming process thus achieved, however, are greatly dependent on the manufacturing process and on the geometry of the Zener diodes; this requires the characteristics of these Zener diodes to be defined extremely carefully.

In both of the above-mentioned solutions, the firing pads take up a considerable amount of space on a semiconductor chip in which the integrated device is formed; this leads to the need to limit the number of firing pads, and hence trimming elements, correspondingly limiting the degree of accuracy which can be achieved.

Moreover, both the metal zapping technique and the Zener zapping technique are generally applied to a wafer of semiconductor material on which the same integrated device is simultaneously formed in several identical areas. The use of these solutions in an integrated device encapsulated in a package in fact requires too great a number of external pins (connected to the firing pads) and metal connection tracks which are very wide in order to be able to withstand the current necessary to blow the metal fuses or the Zener diodes. The trimming process consequently cannot correct variations in the characteristic parameter of the circuit element caused by mechanical and thermal stresses undergone by the integrated device during an encapsulation operation.

SUMMARY OF THE INVENTION

An embodiment of the present invention overcomes the above-mentioned drawbacks. The embodiment provides an integrated device comprising a circuit element and a plurality of trimming elements which are connectable selectively to the circuit element for achieving a predetermined tolerance of a characteristic parameter of the circuit element. The integrated device includes a plurality of electronic switches each switchable between a first state and a second state that respectively activates and deactivates a corresponding one of the trimming elements, and means for storing an indication of the states of the electronic switches and for operating each electronic switch in the first state or in the second state, in accordance with the indication stored.

Moreover, the present invention also proposes a corresponding method of producing an integrated device.

BRIEF DESCRIPTION OF THE DRAWINGS

Further characteristics and the advantages of the integrated device according to the present invention will become clear from the following description of a preferred embodiment thereof, given by way of non-limiting example, with reference to the appended drawings, in which.

DETAILED DESCRIPTION OF THE INVENTION

Figure 1:
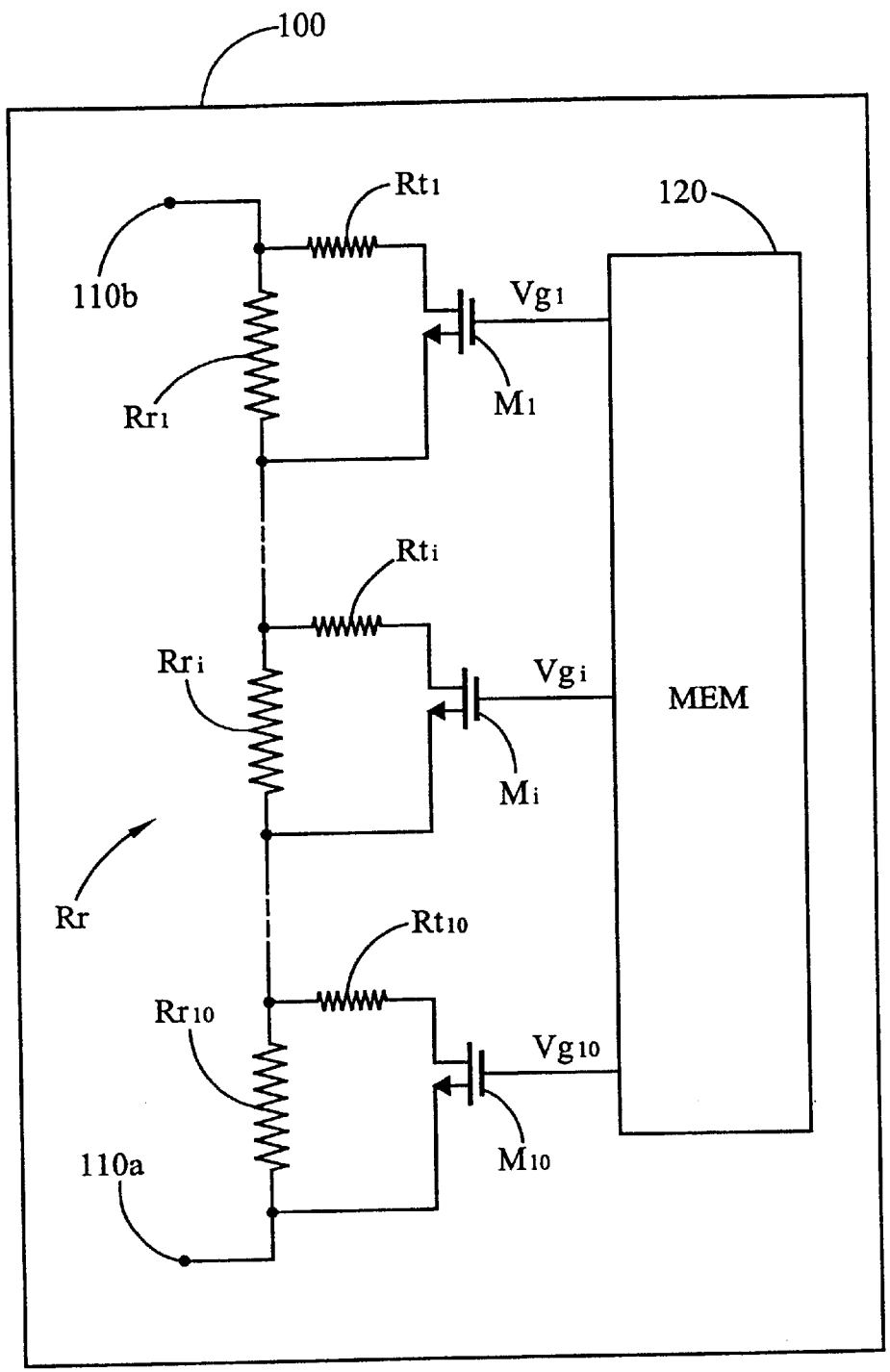
FIG. 1 shows the integrated device in schematic form.

With reference in particular to FIG. 1, this shows an electronic device 100 produced in integrated form in a chip of semiconductor material (typically silicon). The integrated device 100 includes a resistor Rr used, for example, for generating a reference voltage for a switching system. The reference resistor Rr is constituted by several elemental resistors Rri (for example, where i=1 . . . 10), connected in series between a terminal 110$a$ and a terminal 110$b$.

A trimming resistor Rti can be connected selectively to each elemental resistor Rri. In particular, a first terminal of the trimming resistor Rti is connected to a first terminal of the elemental resistor Rri. A second terminal of the trimming resistor Rti is connected to a drain terminal of an n-channel MOSFET transistor Mi. A source terminal of the transistor Mi is connected to a second terminal of the elemental resistor Rri.

When the transistor Mi is in a non-conductive state, the trimming resistor Rti is deactivated since it is disconnected from the elemental resistor Rri. When the transistor Mi is in a conductive state, the trimming resistor Rti is activated and is connected in parallel with the elemental resistor Rri. It is thus possible to correct the value of a resistance at the terminals 110a and 110b in order to achieve a desired tolerance of the resistance of the reference resistor Rr.

A gate terminal of each transistor Mi is connected to a corresponding terminal of a storage and control block (MEM) 120. As described in detail below, the block 120 stores information indicative of the states of the transistors Mi (non-conductive or conductive) and operates the transistors Mi in accordance with the information stored. In particular, the storage and control block 120 supplies to the gate terminal of each transistor Mi a control signal Vgi having a value such as to make the transistor Mi non-conductive or conductive.

Similar considerations apply if the elemental resistors, trimming resistors and transistors are in a different number and connected in a different manner, if one or more different circuit elements are provided with corresponding trimming elements (such as, for example, capacitors) and if a different characteristic parameter of each circuit element (such as, for example, a capacitance) is corrected, if the transistors are bipolar or, more generally, if other electronic switches are used, etc.

The solution of the present invention is extremely reliable and flexible.

The information indicative of the states of the electronic switches can be loaded from the exterior with the use of a small number of pins; in particular, the number of pins required is independent of the number of electronic switches to be controlled and hence of trimming elements.

This enables a large number of trimming elements to be used, achieving a very high degree of accuracy. Moreover, this structure enables the required corrections to be performed on an integrated device which is already encapsulated in a package; this leads to greater accuracy since changes in the characteristic parameter of the circuit element caused by mechanical and thermal stresses undergone by the integrated device during an encapsulation stage are also corrected.

Figure 2:
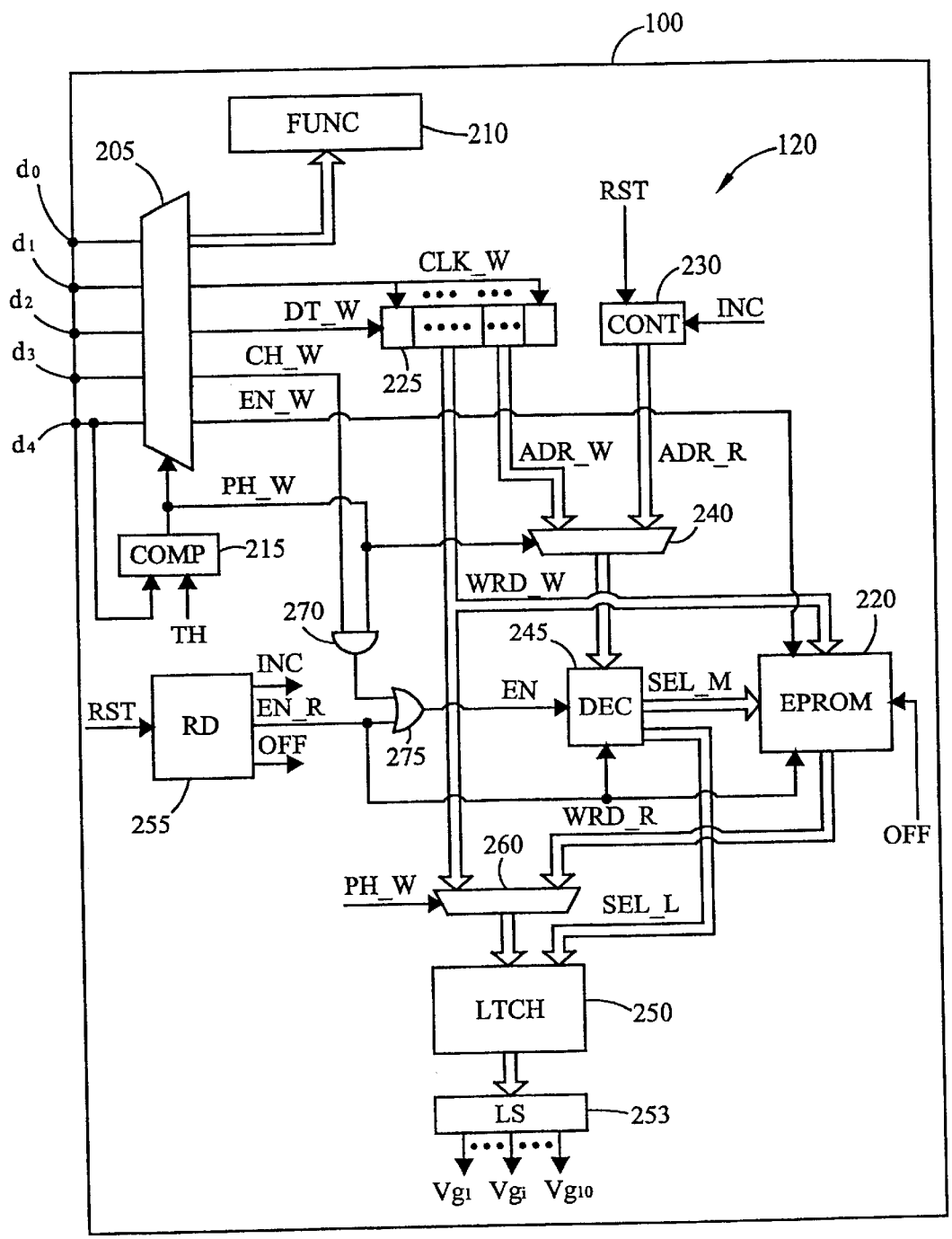
FIG. 2 is a basic diagram of a storage and control block of the integrated device.

With reference now to FIG. 2, the integrated device 100 has several pins for connection to the exterior. A set of pins d0, d1, d2, d3, and d4 (5 pins in the embodiment shown) is connected to a set of input terminals of a demultiplexer 205. A first set of output terminals of the demultiplexer 205 is connected to inputs of a generic functional block (FUNC) 210 of the integrated device 100 (such as, for example, a unit for controlling the switching system).

A second set of output terminals of the demultiplexer 205 is connected to the storage and control block 120; in particular, the terminal associated with the pin d0 supplies a clock signal CLK_W, the terminal associated with the pin d1 supplies a data signal DT_W, the terminal associated with the pin d2 supplies a writing control signal CH_W, and the terminal associated with the pin d3 supplies a writing enabling signal EN_W.

The pin d4 is also connected to a first input terminal of a comparator (COMP) 215; the comparator 215 receives, at a second input terminal, a threshold value TH (equal to a voltage not normally used in the integrated device 100, for example, 12 V). The comparator 215 generates a writing-stage activation signal PH_W indicative of the fact that the signal applied to the pin d4 exceeds the threshold value TH; the signal PH_W is supplied to a control terminal of the demultiplexer 205. The demultiplexer 205 transfers the signals applied to the set of input terminals to one of the sets of output terminals in dependence on the signal PH_W.

The storage and control block 120 comprises an OTP EPROM (one-time programmable, electrical, programmable, read-only memory) 220. The EPROM 220 includes a matrix of non-rewritable cells each of which is associated with one of the electronic switches connected to the trimming elements. Each cell of the EPROM 220 stores a bit having a logic value 0 (for example, equal to 0 V, relative to a reference value or ground) or a logic value 1 (for example, equal to 3 V). The matrix is constituted by $N=2^B$ rows (where, for example, B is equal to 10) and M columns (where, for example, M is equal to 8). The bits stored in the cells of each row of the EPROM 220 define a word and are read or written simultaneously; the cells of each row form an entry which can be selected individually by means of an address constituted by B bits.

The storage and control block 120 has a shift register 225 constituted by M+B cells (each of which stores one bit). The shift register 225, the operation of which is controlled by the signal CLK_W, receives, at a serial input terminal, the signal DT_W. The bits stored in the first M cells (starting from the left-hand side) of the shift register 225 define a word to be written WRD_W, and the bits stored in the last B cells of the shift register 225 define a corresponding writing address ADR_W. The word to be written WRD_W and the writing enabling signal EN_W are supplied to corresponding inputs of the EPROM 220.

The storage and control block 120 also comprises a B-bit counter (CONT) 230 which stores a value ADR_R representative of a reading address. The writing address ADR_W and the reading address ADR_R are supplied to separate inputs of a multiplexer 240 which is controlled by the signal PH_W. The multiplexer 240 transfers to its output the address (ADR_W or ADR_R) applied to one of its inputs, in dependence on the signal PH_W; this address is supplied to an input of a decoder (DEC) 245. The decoder 245 generates a row selection signal SEL_M for the EPROM 220. In particular, the signal SEL_M is constituted by N lines (word lines) one for each row of the EPROM 220; a single word line at a time is activated (by being brought to a different voltage value in dependence on the type of operation, that is, reading or writing, to be performed) in dependence on the address received.

A further row selection signal SEL_L is supplied as an input to a latching block (LTCH) 250 constituted by a matrix of N rows and M columns of latches, for example D-latches. The signal SEL_L is similar to the signal SEL_M with the sole difference that different voltage values (suitable for operating the latches of the latching block 250) are used. The logic values stored in the latches of the latching block 250 are supplied as inputs to a level-shifting block (LS) 253 which controls directly the electronic switches connected to the trimming element. For example, the latches of each row control (by means of the shifting block 253) the electronic switches associated with a single circuit element (such as the reference resistor described above); in particular, the signal Vgi has a value such that the voltage between the gate terminal and the source terminal of the transistor connected to the trimming resistor makes this transistor non-conductive and conductive when the logic value 0 and the logic value 1 are stored in the latch, respectively.

An initialization signal RST of the integrated device 100 (received directly from the exterior or from another block of the integrated device 100) is applied to a reset input of the counter 230. The signal RST is also supplied as an input to a reading block (RD) 255. The reading block 255 generates an increment signal INC for the counter 230 and an extinguishing signal OFF for the EPROM 220; moreover, the reading block 255 generates a reading enabling signal EN_R which is supplied to the decoder 245 and to the EPROM 220.

The word to be written WRD_W (stored in the shift register 225) and a word WRD_R read from the EPROM 220 are supplied to separate inputs of a multiplexer 260 which is controlled by the signal PH_W. The word (WRD_W or WRD_R) transferred as an output by the multiplexer 260 is supplied as an input to the latching block 250.

The signal PH_W and the signal CH_W are applied to separate input terminals of an AND logic gate 270. An output terminal of the AND logic gate 270 is connected to a first input terminal of an OR logic gate 275 which receives the signal EN_R at a second input terminal. The OR logic gate 275 generates an enabling signal EN for the decoder 245.

During a trimming process, a voltage above the threshold value TH is applied to the pin d4 so that the signal PH_W is asserted (logic value 1). In this situation, the signals applied to the pins d0–d3 are transferred by the demultiplexer 205 to the storage and control block 120. The signals CH_W and EN_W (applied to the pins d2 and d3, respectively) are deasserted (logic value 0). A series of M+B bits is loaded serially into the shift register 225. In particular, for each trailing edge of the signal CLK_W, the signal DT_W is strobed and the corresponding bit is loaded into the first cell of the shift register 225 (after shifting the bits stored in the other cells to the right). The word WRD_W to be written is thus loaded into the first M cells of the shift register 225 and the corresponding writing address ADR_W is loaded into the last B cells.

This solution enables a small number of pins to be used to load the words to be written in the EPROM from the exterior; this result is achieved with the use of a structure which is extremely simple and compact and, at the same time, sufficiently flexible. Alternatively, two separate shift registers are provided for the word and for the address, solely the word is loaded from the exterior (with the addresses generated automatically in succession), or different loading means (possibly not serial means) are used.

The signal PH_W controls the multiplexers 240 and 260 in a manner such that the writing address ADR_W and the word WRD_W to be written are transferred to the decoder 245 and to the latching block 250, respectively. At this point, the signal CH_W is asserted so that the signal output by the AND logic gate 270 is asserted. The signal EN is consequently asserted and enables the decoder 245. The lines of the signal SEL_M and SEL_L corresponding to the writing address ADR_W are activated; the signal EN_R is deasserted, so that the activated line of the signal SEL_M is brought to the writing voltage value. The word WRD_W is consequently loaded into the corresponding latches of the latching block 250 (no word is written in the EPROM 220 since the signal EN_W is deasserted).

The logic values thus loaded into the latches of the latching block 250 control (by means of the shift block 253) the corresponding electronic switches connected to the trimming elements. If these logic values do not provide the desired tolerance of the circuit element, the operations described above are repeated in order to load a different word into the latching block.

If, on the other hand, the logic values provide the desired tolerance, they are written permanently in the EPROM 220. In particular, the signal EN_W is asserted; this signal enables the word WRD_W (supplied as an input to the EPROM 220) to be written in the row selected by the activated line of the signal SEL_M (corresponding to the writing address ADR_W).

The operations described above are repeated until all of the logic values necessary to achieve the desired tolerances of the various circuit elements of the integrated device 100 have been written in the EPROM 220 (generally using all of the cells).

This solution permits the use of a non-rewritable (and hence particularly simple) memory and, at the same time, enables the logic values loaded from the exterior to be checked before they are actually written in the memory EPROM; moreover, this enables various configurations of these logic values to be tried in order to select the one which provides the best results. The integrated device of the present invention may, however, also be formed with the use of a rewritable memory, or with the logic values stored directly in the EPROM without being checked.

During normal operation of the integrated device 100, the voltage applied to the pin d4 has a value which is always less than the threshold value TH so that the signal PH_W is deasserted. In this situation, the signals applied to the pins d0–d4 are transferred by the demultiplexer 205 to the functional block 210.

The pins required for the trimming process are thus also used during the normal operation of the integrated device. This result is achieved simply by a comparator and without dedicating any pins to a selection function (trimming process or normal operation). Similar considerations apply if there is a different number of pins, or if other equivalent external terminals are provided, if another threshold value is used, etc. The integrated device of the present invention may, however, also be implemented with a dedicated selection pin, or with pins used solely for the trimming process.

Upon each initialization of the integrated device 100, the signal RST is asserted so that the counter 230 is reset. The signal PH_W controls the multiplexer 240 in a manner such that the reading address ADR_R stored in the counter 230 (which initially is equal to zero) is transferred to the decoder 245.

The reading block 255 asserts the signal EN_R. The signal EN is consequently asserted and enables the decoder 245. The lines of the signals SEL_M and SEL_L corresponding to the reading address ADR_R are activated; since the signal EN_R is asserted, the activated line of the signal SEL_M is brought to the reading voltage value. The signal EN_R then enables the word WRD_R selected by the signal SEL_M to be read from the EPROM 220. At the same time, the signal PH_W controls the multiplexer 260 in a manner such that the word WRD_R read is transferred to the latching block 250. This word is loaded into the latches of the latching block 250 selected by the signal SEL_L.

At this point, the reading block 255 asserts the signal INC, so that the reading address ADR_R stored in the counter 230 is increased by one; the corresponding word WRD_R is then read from the EPROM 220 and loaded into the latching block 250. The operations described above are repeated until all of the words stored in the EPROM 220 have been loaded into the corresponding latches of the latching block 250. At this point, the reading block 255 asserts the signal OFF, so that the EPROM 220 is deactivated.

The embodiment described above is particularly simple and effective. The latching block enables an existing memory structure (with cells accessible solely by rows) to be used and, at the same time, enables all of the logic values stored in the EPROM to be available directly for controlling the electronic switches; this latching block makes the integrated device very reliable, since the cells of the EPROM are subjected to a small number of reading operations (only during the initialization of the integrated device). Moreover, the fact that the EPROM is deactivated once all of the logic values have been loaded into the latching block drastically reduces the power consumption of the integrated device.

Similar considerations apply if the storage and control block has a different structure, if the electronic switches are controlled in a different manner, if the logic values 0 and 1 are represented by other voltage values, etc. Alternatively, the latches are of a different type, an $E^2$PROM memory, a buffered RAM memory, or any other non-volatile memory is used; the integrated device of the present invention may, however, also be formed with a multilevel cell memory structure (each cell being associated with two or more electronic switches), without the latching block, or without deactivation of the EPROM.

Naturally, in order to satisfy contingent and specific requirements, an expert in the art may apply to the above-described integrated device many modifications and variations all of which, however, are included within the scope of protection of the invention as defined by the appended claims.

We claim:

1. An integrated device, comprising:
   at least one circuit element;
   a plurality of trimming elements connectable selectively to the at least one circuit element for achieving a predetermined tolerance of a characteristic parameter of the at least one circuit element;
   a plurality of electronic switches each switchable between a first state and a second state that activates and deactivates a corresponding one of the trimming elements, respectively; and
   storage and control means for storing an indication of the states of the electronic switches and for operating each electronic switch in the first state or in the second state, according to the indication stored.

2. An integrated device according to claim 1, wherein the storage and control means include a memory having a plurality of cells, each associated with a corresponding one of the electronic switches, for storing a first logic value or a second logic value, each electronic switch being operated in the first state when the corresponding cell stores the first logic value and in the second state when the corresponding cell stores the second logic value.

3. An integrated device according to claim 2, wherein the storage and control means further include a latching block having a plurality of latches, the number of latches being equal to the number of cells, and means for copying the logic value stored in each cell into a corresponding one of the latches, each latch controlling the corresponding electronic switch.

4. An integrated device according to claim 3, in which the cells are grouped in a plurality of entries addressable individually, the copying means simultaneously reading the logic values stored in the cells of each entry and storing the logic values read in the corresponding latches.

5. An integrated device according to claim 3, further comprising means for deactivating the memory once all of the logic values stored in the cells have been copied into the corresponding latches.

6. An integrated device according to claim 3, wherein the memory is non-rewritable, the integrated device further comprising means for loading the logic values to be written in the cells of each entry from the exterior into the corresponding latches and means for simultaneously writing the logic values loaded into the cells of the entry.

7. An integrated device according to claim 6, wherein the loading means include a shift register for receiving serially the logic values to be written in the cells of the entry and for supplying in parallel, to the memory and to the latches, the logic values received.

8. An integrated device according to claim 1, further comprising at least one functional block, at least one external terminal for applying signals to the integrated device, and a multiplexer for supplying the applied signals selectively either to the storage and control means or to the at least one functional block.

9. An integrated device according to claim 8, further comprising a comparator connected to one of the external terminals, the comparator generating a signal for controlling the multiplexer in dependence on a comparison of the signal applied to the terminal connected to the comparator with a threshold value.

10. A method of producing an integrated device, comprising the steps of: providing at least one circuit element;
   providing a plurality of trimming elements connectable selectively to the at least one circuit element for achieving a predetermined tolerance of a characteristic parameter of the at least one circuit element;
   providing a plurality of electronic switches each switchable between a first state and a second state in which activates and deactivates a corresponding one of the trimming elements, respectively; and
   storing an indication of the states of the electronic switches, each electronic switch being operated in the first state or in the second state according to the indication stored.

* * * * *